United States Patent
Fann et al.

(10) Patent No.: US 7,952,192 B2
(45) Date of Patent: May 31, 2011

(54) MELTING TEMPERATURE ADJUSTABLE METAL THERMAL INTERFACE MATERIALS AND PACKAGED SEMICONDUCTORS INCLUDING THEREOF

(75) Inventors: Yuan-Chang Fann, Hsinchu County (TW); Jenn-Dong Hwang, Hsinchu (TW); Cheng-Chou Wong, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 199 days.

(21) Appl. No.: 12/477,895

(22) Filed: Jun. 3, 2009

(65) Prior Publication Data
US 2009/0236729 A1    Sep. 24, 2009

Related U.S. Application Data

(63) Continuation-in-part of application No. 11/735,443, filed on Apr. 4, 2007, now Pat. No. 7,576,428.

(30) Foreign Application Priority Data

Nov. 15, 2006  (TW) .............................. 95142234 A
Feb. 15, 2007  (TW) .............................. 96105743 A

(51) Int. Cl.
*H01L 23/373* (2006.01)
(52) U.S. Cl. ................... 257/712; 257/717; 257/E23.11
(58) Field of Classification Search .................. 257/712, 257/717, E23.11
See application file for complete search history.

(56) References Cited

U.S. PATENT DOCUMENTS 6,791,839 B2 *   9/2004   Bhagwagar ................... 361/705
2007/0228109 A1 * 10/2007   Smith et al. ................... 228/176

* cited by examiner

*Primary Examiner* — Victor Mandala
(74) *Attorney, Agent, or Firm* — Jianq Chyun IP Office

(57) ABSTRACT

A melting temperature adjustable metal thermal interface material (TIM) and a packaged semiconductor including thereof are provided. The metal TIM includes about 20-98 wt % of In, about 0.03-4 wt % of Ga, and at least one element of Bi, Sn, Ag and Zn. The metal TIM has an initial melting temperature between about 60-144° C.

14 Claims, 3 Drawing Sheets

MELTING TEMPERATURE ADJUSTABLE METAL THERMAL INTERFACE MATERIALS AND PACKAGED SEMICONDUCTORS INCLUDING THEREOF

CROSS-REFERENCE TO RELATED APPLICATION

This application is a continuation-in-part of a prior application Ser. No. 11/735,443, filed Apr. 14, 2007 now U.S. Pat. No. 7,576,428, which claims the priority benefit of Taiwan application serial no. 95142234, filed on Nov. 15, 2006 and Taiwan application serial no. 96105743, filed on Feb. 15, 2007. The entirety of each of the above-mentioned patent applications is hereby incorporated by reference herein and made a part of this specification.

BACKGROUND OF THE INVENTION

1. Field of the Invention

The present invention relates to a melting temperature adjustable metal thermal interface material (TIM) and a packaged semiconductor including thereof.

2. Description of Related Art

Packaged semiconductors such as LEDs having high luminance, power insulation gate transistor, graphics chip, central processing units (CPUs) and so on generate higher and higher heat flow density during operation or operate at high temperature circumstance, resulting in the generation of potential hot spots. Thus, it is necessary to reduce the high heat flux so as to drop the operation temperature of the packaged semiconductors under the maximum junction temperature thereof. In order to prevent overheating of chips, current technology of packaged semiconductors have been developed toward one of either a multiple cores, dynamic voltage and/or frequency scaling, miniaturization in integrated circuits, or a combination of these varieties to reduce the generated heat energy during operation. In addition, a heat dissipation device with high heat radiation performance and a TIM with low interface thermal resistance (or labeled as "thermal impedance") may also be applied to improve heat dissipation of the packaged semiconductors. The latter is a simpler and achievable solution.

The position of the TIM applied in the packaged semiconductors includes, for example, a first-stage thermal interface between an integrated circuit (IC) die and the heat spreader lid inside a packaged IC or a second-stage thermal interface between the heat spreader lid and a heat dissipation device outside the packaged IC. Thermal greases and low melting point alloys (LMAs) possess low interface thermal resistance among all kinds of TIMs currently. However, thermal greases are prone to dry out at severe high-temperature circumstance gradually, or they may be extruded out the thermal interface little by little due to a cycling thermal stress generated when the packaged semiconductors operate at varying power levels, finally resulting in a poor thermal contact resistance of thermal interfaces. The LMAs suitable for thermal interface have typically a property of phase change from solid to slurry in the interface or act like cream at solid state, and thus they conform to the interface surface throughout. Although LMAs could outperform thermal greases with better interfacial heat-conduction performance because of the benefit of melting/solidification reaction caused by interface temperature fluctuation, which promote large absorption and dispersion of joule heat passing through the interface. Conventional LMAs are either eutectic alloys, near eutectic alloys, or pure metals of easily deformed, for example, pure indium. Due to melting effects of eutectic composition or pure metal, consequently conventional LMAs have quite narrow temperature range of melting and are unable to adjust inherently melting points to best meet interface requirements of varying packaged semiconductors. According to the match issue for junction temperature range of the packaged semiconductors, most of the LMAs are not suitable for thermal interface application due to their fixed eutectic temperatures and narrow range of melting temperatures. After accomplishing the "Restriction of the use of certain hazardous substance in EEE (ROHS)" regulated by the European Union, the alloy consisting of Pb and/or Cd and parts or all of Bi, In, Sn and so on is excluded, and thus selection of the LMAs suitable for thermal interface application is more reductive.

The statement about the limitation of conventional LMAs for thermal interface application is as follows.

The first-stage thermal interface material between the IC die and the heat spreader lid connected thereof has to adequately accommodate the thermal stress or twist deformation caused by thermal expansion mismatch between the IC die and the heat dissipation device, besides jointing said two elements and maintaining a low interface thermal resistance. For conventional LMAs possessing a melting temperature higher than a junction temperature range of the IC die, said solid LMAs often have intolerable Young's modulus up to tens of Gpa and are hard to accommodate the thermal stress inside the package, and consequently the operating IC die may take the risk of early fatigue fracture. Because of above-mentioned problem, most of LMAs are excluded except for soft metals such as pure indium or In—Ag alloy composed of low solutes. If a conventional LMA having a melting temperature less than or within the junction temperature range of the IC die is used, the LMA will be easily heated to slurry state with high fluidity due to its narrow temperature range of melting; therefore it is difficult to joint the IC die and the heat dissipation device steadily. Although indium or In—Ag alloy composed of low solutes are currently utilized to the first-stage thermal interface, the soft metal is designed to keep solid state throughout during operation of the IC die, so it is hard to achieve the latent heat effect of melt for absorbing large heat energy. In addition, pure indium or In—Ag alloy may be overheating and prone to generate shrinkage voids within joint interface layer if the solder reflow process of chip package is performed utilizing a lead-free solder with melting temperature more than 220° C. In some cases, there exist a need to utilize a metal TIM having quite a wide temperature range of melting and a liquidus temperature greater than that of pure indium, if there exists a necessity of applying a lead-free solder with high melting temperature.

The need of TIM applied for the second-stage thermal interface is mainly to maintain stable and high thermal conduction efficiency. Thus, the broader the range of melting temperature from solid to liquid of LMA, the better the interface performance of LMA. Therefore, a LMA with much broader range of melting temperature will be easier to keep in semisolid state to efficiently bring the desired latent heat benefits of fusion. The interface temperature outside the packaged semiconductors ranges mostly between 40° C. and 100° C. Due to ROHS regulated by the European Union, known LMAs which have melting point within said interfacial temperature range are only eutectic In—Bi—Sn alloy, eutectic In—Bi alloy and eutectic Bi—In—Sn alloy. In other words, the heat-conductive progress of above-mentioned alloys is still inherently constrained by narrow melting temperature range. When the interfacial temperature is higher than eutectic temperature of the eutectic alloy, the eutectic alloy will be easily heated into liquid state, resulting in melt overflow at the thermal interface. When the interfacial temperature is less than the eutectic temperature of the eutectic alloy, irregular surface voids of the thermal interface should be filled in advance by liquid phase of the eutectic alloy for subsequent interface application. A method called as "burn in" is often used so as to fill the interface surface voids as applying the eutectic alloy to a interface. However, the reflow heating is generally applied in chip package, so the "burn in" process in the second-stage thermal interface will increase the assembled complexity of packaged semiconductors. Furthermore, the eutectic alloys need to "burn in" hardly achieve the latent heat effect of melt.

To sum up, conventional LMAs are limited by eutectic point that is hard to adjust and narrow temperature range of fusion, so that only few alloys are accepted for thermal interface application of specific packaged semiconductors.

Accordingly, there is a need to develop a metal TIM having an adjustable melting temperature and/or a broad temperature range of melting, which is very much suitable for the thermal interface of the varying packaged semiconductors.

SUMMARY OF THE INVENTION

The present invention is directed to a metal TIM. The initial melting temperature of the meal TIM can be adjusted to desired temperature and the metal TIM has a broad range of melting temperature to best meet the need of the thermal interface.

The present invention is further directed to a melting temperature adjustable metal TIM. The initial melting temperature of the meal TIM can be adjusted down by merely adding a limited amount of solute so as to broaden the range of melting temperature.

The present invention is further directed to a metal TIM with a property of having broad range of melting temperature. Therefore, the initial melting temperature of the meal TIM can be designed within the operating junction temperature range of a packaged semiconductor, and the temperature of heating the metal TIM into liquid state completely is higher than the maximum junction temperature of the packaged semiconductor, especially the melting point of pure indium. When the metal TIM is applied at the first-stage thermal interface, it is not easy to be overheated into complete liquid state during reflow process of the packaged semiconductors.

The present invention provides a metal TIM including about 20-98 wt % of In, about 0.03-4 wt % of Ga, and at least one element of Bi, Sn Ag and Zn, wherein the metal TIM has an initial melting temperature between about 60-144° C.

The present invention further provides a packaged semiconductor including a packaged substrate having a conductive line thereon, an IC die, a thermal element, a heat dissipation device, and a printed circuit board (PCB). The IC die is disposed on a surface of the packaged substrate that has the conductive line. The thermal element is disposed on the integrated circuit die, and a heat dissipation device is disposed on the thermal element. The printed circuit board is electrically connected to the packaged substrate. Furthermore, a first TIM is disposed between the integrated circuit die and the thermal element, and a second TIM is disposed between the thermal element and the heat dissipation device, wherein the first TIM and/or the second TIM is the foregoing metal TIM of the present invention.

The present invention further provides a packaged semiconductor including a multilayer packaged substrate, a die, a heat dissipation device, a first and a second TIMs. The multilayer packaged substrate includes a heat spreading material, a dielectric layer on the heat spreading material and a conductive line on the dielectric layer. The die is electrically connected to the conductive line of the multilayer packaged substrate, and the heat dissipation device is disposed below the multilayer packaged substrate. The first TIM is disposed between the die and the multilayer packaged substrate, and a second TIM is disposed between the multilayer packaged substrate and the heat dissipation device, wherein the first TIM and/or the second TIM is the foregoing metal TIM of the present invention.

The present invention further provides a packaged semiconductor including a semiconductor circuit device, a thermal element, a heat dissipation device, and a TIM. The semiconductor circuit device is operated at a temperature range. The thermal element has an inner surface and a outer surface, wherein the inner surface is disposed on the semiconductor circuit device. The heat dissipation device is disposed on the outer surface of the thermal element, and the TIM is disposed at an interface of a thermal conduction path from the semiconductor circuit device to the heat dissipation device, wherein the TIM is the foregoing metal TIM of the present invention.

In order to make the aforementioned and other objects, features and advantages of the present invention more comprehensible, several embodiments accompanied with figures are described in detail below.

DESCRIPTION OF EMBODIMENTS

Figure 1:
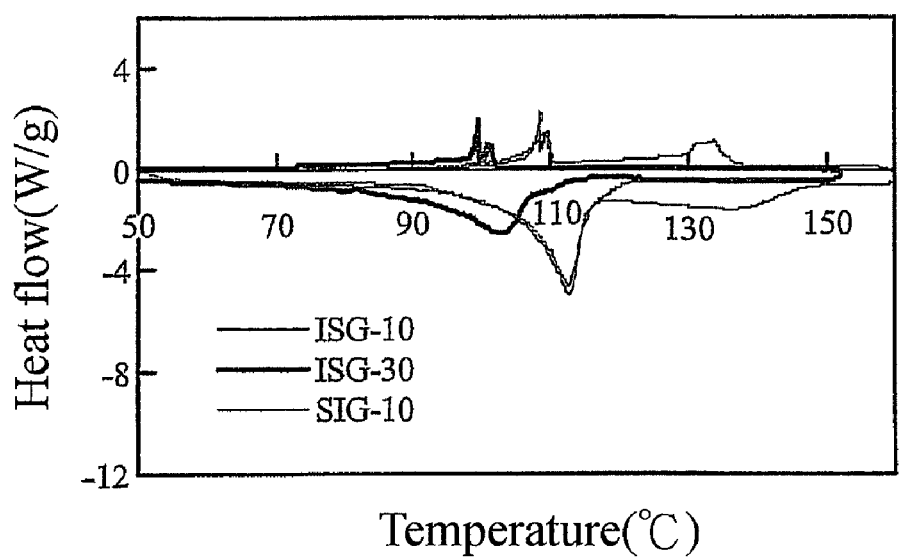
FIG. 1 is a curve showing heat flow variations in a melting reaction and a solidification reaction of metal TIM ISG-10, ISG-30 and SIG-10 alloys according to the present invention.

The composition of the metal TIM in the present invention includes two essential elements, indium (In) and gallium (Ga) and at least one element of bismuth (Bi), tin (Sn), silver (Ag) and zinc (Zn). In the metal TIM, the content of Ga is about between 0.03 wt % and 4 wt %, and the content of In is about between 20 wt % and 98 wt %. The higher the Ga content of metal TIM is, the lower an initial melting temperature of the metal TIM is, and the broader a range of melting temperature of the metal TIM is. Here, every element including Bi, Sn, Ag and Zn can form an eutectic alloy with In; for example, the eutectic alloy includes one composed of high solutes such as In-33.7Bi eutectic alloy or In-48Sn eutectic alloy, or one composed of low solutes such as In-2.2Zn eutectic alloy or In-3Ag eutectic alloy. In addition, the metal TIM may include In, Ga, and all element of Bi, Sn, Ag and Zn, if necessary. According to phase diagrams of In—Bi, In—Sn and In—Bi—Sn, the composition ranges for forming solid solution are very broad, so the solvent atom of different composition of the metal TIM can be Bi, Sn or In so as to form Bi alloy, Sn alloy or In alloy. Based on above, in the present invention, the different composition of the metal TIM may be In—Sn—Ga, Sn—In—Ga, In—Bi—Ga, In—Bi—Sn—Ga, Bi—In—Sn—Ga, In—Bi—Sn—Zn—Ga, In—Bi—Sn—Ag—Zn—Ga, In—Sn—Ag—Ga and so on.

Moreover, the composition of the metal TIM further at least includes other elements such as Au, Cu, B, Ti, Zr, Ni, Sb, Ge, Ce, La, Sc, Y, Pb, Cr, Cd, Si, etc. Actually, the composition of the metal TIM meets the RoHS in the present invention, but it is not limited thereto. In the case of not being main solute element, a trace of hazardous elements such as Pb, Cd, Hg and so on may be utilized in the metal TIM of the present invention, preferably less than 0.03 wt %.

The differences between the metal TIM of the present invention and conventional LMA in melting property are as follows. The melting temperature of metal TIM of the present invention is affected by the eutectic temperatures of main solvent element and solute element, but it still can be adjusted down by adding about 0.03-4 wt % of Ga. The higher the addition amount of Ga is, the lower the initial melting temperature of the metal TIM is. Therefore, the range of melting temperature of the metal TIM is broader than conventional LMA. According to different compositions of alloy, the lowest initial melting temperature is not less than 60° C. and the highest initial melting temperature is not more than 144° C. When the metal TIM with broad range of melting temperature is applied at the first-stage thermal interface, it can be easily heated to semi-solid state by heat energy generated from operation of a packaged semiconductors, thereby accommodating thermal stress inside the packaged semiconductors or causing a melting/solidification reaction at the junction interface for absorbing and conducting high heat flow density rapidly. In addition, when main solvent element of the metal TIM of the present invention is Sn, the temperature of heating the metal TIM into liquid state completely can be higher than the melting point of pure indium, and consequently the metal TIM is not easy to be overheated into complete liquid state during reflow process of the packaged semiconductors.

The following descriptions are the embodiments of the metal TIM and the packaged semiconductor respectively. The embodiment of the metal TIM is to explain different compositions of the metal TIM and variation in melting temperature thereof and compare the metal TIM with conventional LMA and thereby showing features of the metal TIM of the present invention not limiting scope of the metal TIM. The following embodiments are respectively listed with regard to different compositions of In—Bi—Ga alloy, In—Sn—Ga alloy and In—Ag—Ga alloy and data about the melting temperatures thereof.

To clearly show the differences between the metal TIM of the present invention and conventional LMA, thermal analysis is implemented for comparison. The thermal analysis is utilized with a DuPont Instruments Differential Scanning Calorimeter (DSC) 910. Each metal sample is pressed into superimposed aluminum crucibles, and then heated from room temperature to melt into liquid and then cooled down to room temperature. The thermal analysis for each of the metal sample focuses on an initial melting temperature ($T_i$), an extrapolated onset melting temperature ($T_{onset}$) and a peak melting temperature ($T_p$) of a melting reaction.

Table 1 lists the values of the initial melting temperatures and the peak melting temperatures of In—Bi—Ga alloys with different content of Ga. In Table 1, the initial melting temperatures of In—Bi—Ga alloys are dropped with the increase of Ga content. It should be noted that the content of In is increased and the content of Bi is reduced in order to apply the In—Bi—Ga alloys at the first-stage thermal interface besides for application at the second-stage thermal interface. Furthermore, the content of Ga could be controlled not to let the initial melting temperatures of In—Bi—Ga alloys being less than 60° C.

TABLE 1

| Alloy Composition | In | Bi | Ga | $T_i$ | $T_p$ |
|---|---|---|---|---|---|
| | (unit: wt %) | | | (unit: ° C.) | |
| In—30Bi (for contrast) | 70 | 30 | — | 72 | 74 |
| In—29.9Bi—0.5Ga | 69.6 | 29.9 | 0.5 | 62 | 73 |
| In—30Bi—0.1Ga | 69.9 | 30 | 0.1 | 70 | 75 |

Table 2 lists the values of the initial melting temperatures and the peak melting temperatures of In—Sn—Ga and Sn—In—Ga alloys with different content of Ga. FIG. 1 is a curve showing heat flow variations in a melting reaction and a solidification reaction of In-47.5Sn-1Ga alloy (as called "ISG-10" thereinafter), In-46.6Sn-3Ga alloy (as called "ISG-30" thereinafter) and Sn-44In-1Ga alloy (as called "SIG-10" thereinafter). According to the difference between the curves of the melting reactions from ISG-10 and ISG-30, it is obviously that the addition of Ga has effects on dropping the initial melting temperature and broadening the range of the melting temperature. Based on the difference between the curves of the melting reactions from SIG-10 and ISG-10, it shows that the temperature for heating those alloys into complete liquid state is increased when the solvent atom is changed from In to Sn. Moreover, the temperature for heating Sn—In—Ga alloys into complete liquid state can be further increased with the increase of composition ratio of Sn, and it is higher than the melting point of pure indium, 157° C.

TABLE 2

| Alloy Composition | In | Sn | Ga | $T_i$ | $T_p$ |
|---|---|---|---|---|---|
| | (unit: wt %) | | | (unit: ° C.) | |
| In—48Sn (for contrast) | 52 | 48 | — | 119 | 122 |
| In—35Sn—1Ga | 64 | 35 | 1.0 | 85 | 116 |
| In—42Sn—1Ga | 57 | 42 | 1.0 | 95 | 121 |
| In—44Sn—1Ga | 44 | 55 | 1.0 | 92 | 113 |
| In—46.6Sn—3Ga | 50.1 | 46.6 | 3.0 | 78 | 103 |
| In—47.5Sn—1Ga | 51.5 | 47.5 | 1.0 | 87 | 113 |

Figure 2:
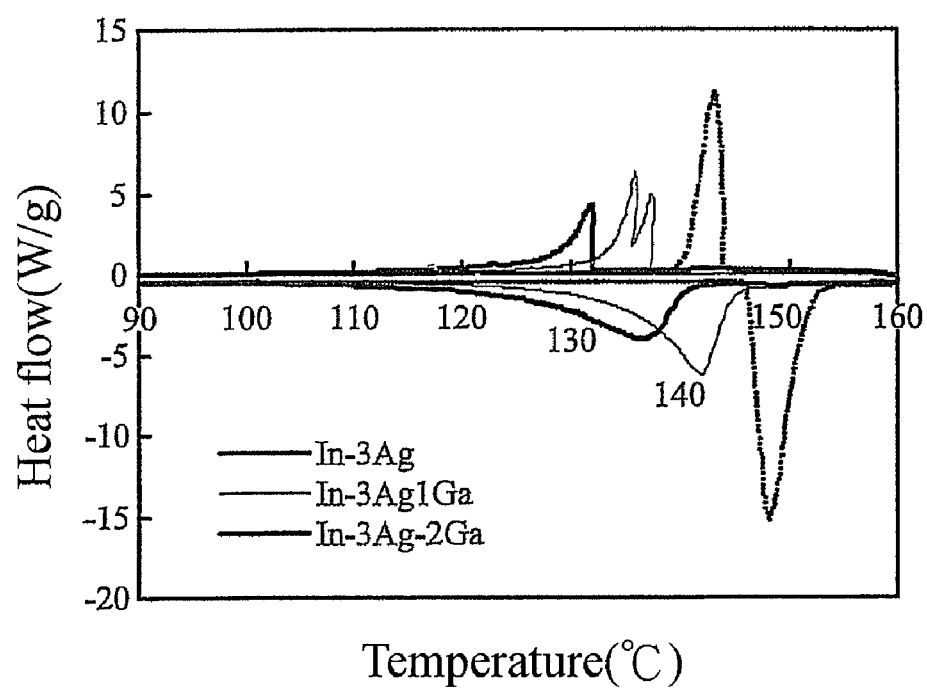
FIG. 2 is a curve showing heat flow variations in a melting reaction and a solidification reaction of metal TIM IAG-10, IAG-20 and known eutectic alloys of In-3Ag according to the present invention.

Table 3 lists the values of the initial melting temperatures and the peak melting temperatures of In—Ag—Ga alloys with different content of Ga. Similarly, the initial melting temperatures of In—Ag—Ga alloys are dropped with the increase of Ga content. FIG. 2 is a curve showing heat flow variations in a melting reaction and a solidification reaction of In-3Ag-1Ga alloy (as called "IAG-10" thereinafter), In-3Ag-2Ga alloy (as called "IAG-20" thereinafter) and contrastive In-3Ag alloy (as called "E. In—Ag" thereinafter). It is obviously that the addition of Ga has an effect on dropping the initial melting temperature.

TABLE 3

| Alloy Composition | In | Ag | Ga | $T_i$ | $T_p$ |
|---|---|---|---|---|---|
| | (unit: wt %) | | | (unit: ° C.) | |
| In—3Ag (for contrast) | 97 | 3 | — | 146 | 148 |
| In—3Ag—2Ga | 95 | 3 | 2.0 | 108 | 137 |
| In—3Ag—1Ga | 96 | 3 | 1.0 | 114 | 142 |
| In—3Ag—0.5Ga | 96.5 | 3 | 0.5 | 126 | 145 |
| In—3Ag—0.03Ga | 96.97 | 3 | 0.03 | 143 | 147 |

The embodiments of various applications with the metal TIM of the present invention are below with FIG. 3 and FIG. 4. It should be noted that the type and disposition of heat dissipation devices as shown in figures are only for illustration and not for limiting the scope of the present invention. Furthermore, the metal TIM of the present invention is not merely applied on the interfacial thermal conduction of packaged semiconductors in figures, but on that of various heat generating elements.

Figure 3:
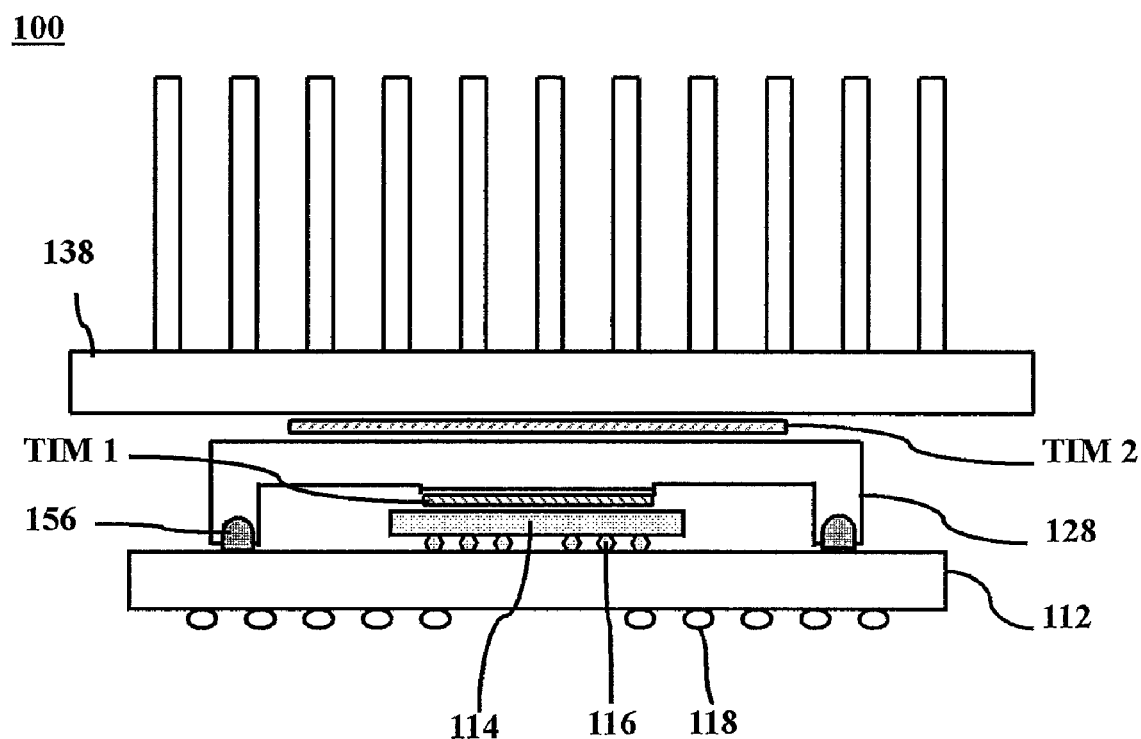
FIG. 3 shows an application of the metal TIM for the packaged semiconductors according to one embodiment of the present invention.

FIG. 3 shows an application of the metal TIM for the packaged semiconductors according to one embodiment of the present invention. The metal TIM can be used to the first-stage and/or the second-stage interfacial thermal conduction, especially used at the first-stage thermal interface or the second-stage thermal interface that generates high heat flux. As shown in FIG. 3, a packaged semiconductor device 100 includes an IC die 114 and a packaged substrate 112 electrically connected thereto. The electrical connection of the IC die 114 and the packaged substrate 112 is accomplished by C4 (Controlled Collapse Chip Connection) connection process. That is, several metal bumps 116 are formed on pads (not shown) of the IC die 114, and a reflow process is then performed to bond and connect the metal bumps 116 of the IC die 114 and lines of the packaged substrate 112 after aligning them. In this embodiment, even if the circuit is bonded by an eutectic reaction on the metal bumps 116 through the reflow process, the IC die 114 and the packaged substrate 112 are also bonded by other methods like wire bonding.

The packaged semiconductor device 100 further includes a plurality of array solders 118 disposed on a back of the packaged substrate 112. The metal bumps 116 and the solders 118 can be electrically connected by the structures such as pads, vias and so on (not shown) in the packaged substrate 112. The packaged semiconductor device 100 can be electrically connected to a printed circuit board (PCB) (not shown) via the solders 118 by the reflow process. In this embodiment, the bond of the packaged semiconductor device 100 and the PCB is accomplished through the solders 118 and the reflow process. Alternately, the solders 118 may be changed into pins, and the pins are bonded to a socket of the PCB or welded in vias of the PCB.

When the packaged semiconductor device 100 works, the heat generated from the IC die 114 will move from inner of the packaged structure toward environment. To ensure the bond between a back of the IC die 114 and a thermal element 128 having heat exchange function and to improve thermal conduction efficiency of the bonding surface, one or multilayer adhesion layer (not shown) is coated on the back of the IC die 114. The adhesion layer is solderable-wettable and consisted of pure metal such as Cr, V, Au, Ni, Ar and Ti and alloys thereof. The thermal element 128 is an integrated heat spreader (IHS) lid as shown in FIG. 3, for example. A material of the IHS lid may be metal, ceramic or aluminum base complex material of high thermal conduction. In addition, a surface of the thermal element 128 can be coated with one or multilayer solderable-wettable metal layer (not shown) such as Cu or Ni or with a metal-containing organic film to make the thermal element 128 being solderable-wettable.

To reduce the interface thermal resistance between the IC die 114 and the thermal element 128 as low as possible and to stably bond the IC die 114 and the thermal element 128, the first TIM (TIM1) is disposed at a thermal interface between them. To easily adjust the thermal stress at the interface between the IC die 114 and the thermal element 128, the first TIM (TIM1) usually has low Young's modulus. Besides for soft metal that keeps solid state when working the IC die 114, for example, In-2Ag-0.5Ga alloy or In-2Zn-2Ga alloy of low solute composition of the present invention, which easily deforms at room temperature, can be heated to display soft state or generate little quantity of liquid phase. In-46Sn-2Ga alloy or Sn-40In-3Ga alloy can be easily heated to display semi-solid with higher ratio of liquid phase. In the present invention, a thickness of the first TIM (TIM1) can be modified according to the type of a heat dissipation device and the operation condition of the die. In one embodiment, the thickness of the first TIM (TIM1) is between 200 μm and 400 μm. For the control of an interfacial junction thickness of the first TIM (TIM1) in the reflow process, a circular spacer (not shown) can be disposed between the thermal element 128 and the packaged substrate 112 and around the first TIM (TIM1). The spacer has the performance of retarding oxidation rate of the first TIM (TIM1) besides keeping the interfacial junction thickness of the first TIM (TIM1). In addition, a resin underfill (not shown) may be filled in gaps of circuit joints between the IC die 114 and the packaged substrate 112 to improve the bonding strength between them. To enhance the structural strength of the packaged semiconductor device 100, a solder alloy 156 may be used to bond the packaged substrate 112 and the thermal element 128, or the bond of the packaged substrate 112 and the thermal element 128 may be accomplished by curing a solder paste or using screws. A heat dissipation device 138 having fins is on the thermal element 128, and it also functions as heat exchange. A thermal conduction passage is at a junction between a back of the heat dissipation device 138 and a top surface of the thermal element 128. The heat dissipation device 138 is bonded to the thermal element 128 through a second TIM (TIM2). The metal TIM of the present invention is particularly suitable for the first stage of thermal interface between the IC die 114 and the thermal element 128, but it is also suitable for the second-stage thermal interface between the thermal element 128 and the heat dissipation device 138. Furthermore, other metal TIM, thermal grease or thermal gel may be used as the second TIM (TIM2).

Even if FIG. 3 shows a single IC chip package, the same technique can also be used in multichip package. The circuit joints of packaging IC in FIG. 3 are distributed on a front and the back of the packaged substrate 112. However, all of circuit joints of some packaged semiconductors may be disposed on same surface of the packaged substrate 112 according to product property or technical advance of different packaged semiconductor, such as package of optoelectronic semiconductors. Furthermore, for heat dissipation or simplification of the packaged semiconductors, various integrations or variations of disposition can be made to the constitutions of each element within the packaged structure. For instance, the packaged substrate 112 and the thermal element 128 of the packaged semiconductors are integrated into a multilayer packaged substrate having a conductive line, a dielectric layer and a heat spreading material. The multilayer packaged substrate, for example, is a structure of metal core printed circuit board (MCPCB). In other words, the metal TIM of the present invention is not limited to use in the first TIM (TIM1) over the IC die 114 in FIG. 3. Therefore, said metal TIM can be widely utilized to any thermal interfaces in the thermal conduction path from various electronic components or other heat generating elements to a heat dissipation device.

Figure 4:
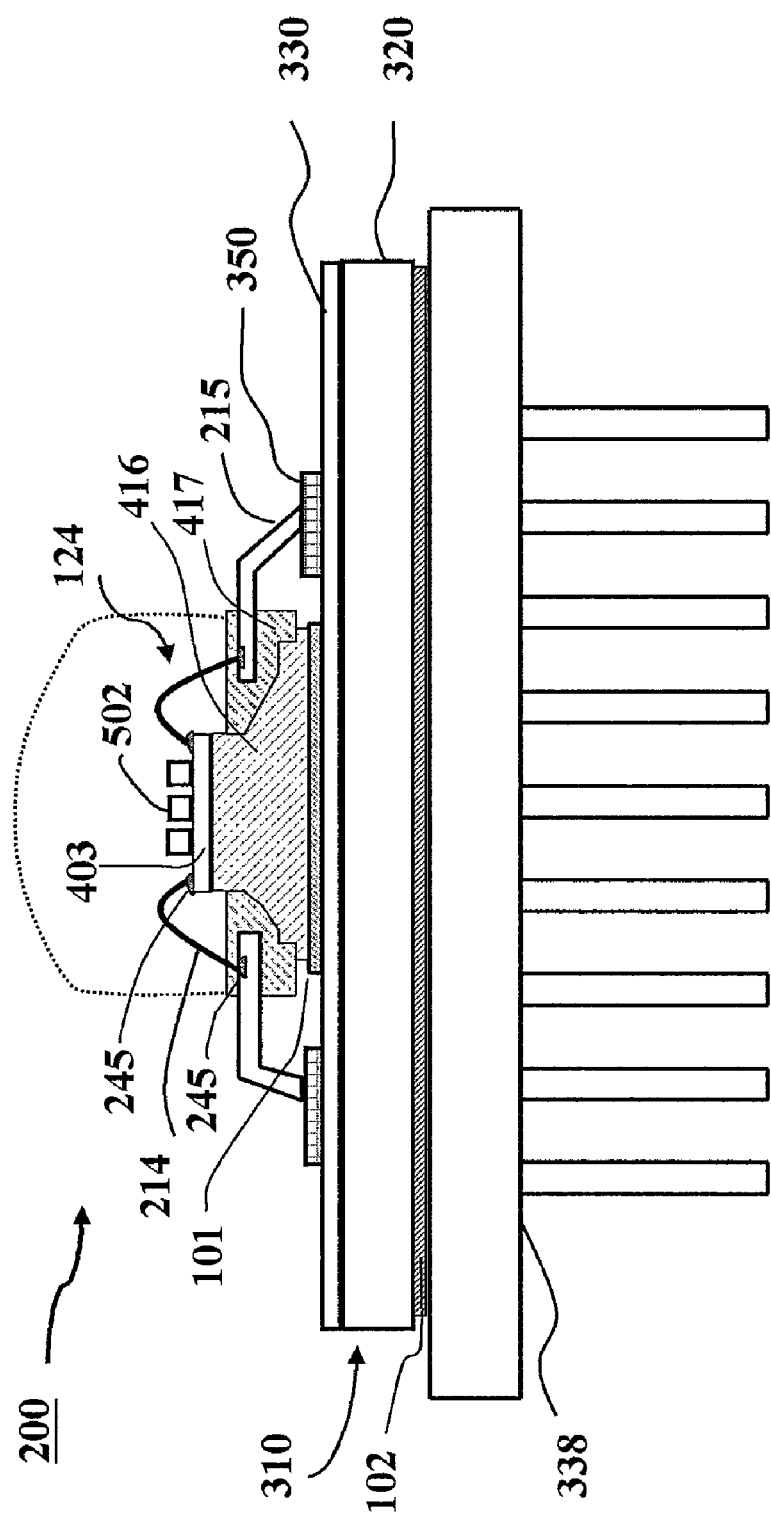
FIG. 4 shows an application of the metal TIM for the packaged semiconductors according to another embodiment of the present invention.

FIG. 4 shows a packaged semiconductor device 200 using a multilayer packaged substrate 310. In FIG. 4, the packaged semiconductor device 200 includes a plurality of optoelectronic semiconductor dies 502, a carrier 124, the multilayer packaged substrate 310 and a heat dissipation device 338. The carrier 124 includes a heat slug 416, an electrical insulating layer 417 on portions of the heat slug 416, a submount 403 electrically connected to the optoelectronic semiconductor dies 502, a plurality of metal lines 214 electrically connected to conduction line (not shown) of the submount 403 through solder joints 245, and a plurality of conductive leads 215 electrically connected to the metal lines 214 through other solder joints 245. The conductive leads 215 protrude from inner of the electrical insulating layer 417. The multilayer packaged substrate 310 includes a thermal sheet 320, a dielectric layer 330 on the thermal sheet 320, and conductive lines 350 electrically connected with the he conductive leads 215 on the dielectric layer 330. The submount 403 and the heat slug 416 are made of thermal conductive material or composite material such as silicon, diamond, aluminum oxide, tungsten, molybdenum, copper, aluminum or boron nitride. A plurality of pads (not shown) of the optoelectronic semiconductor dies 502 such as LED dies or Laser LED dies are electrically connected to a preformed conductive line (not shown) on the surface of the submount 403 by means of forming An/Sn eutectic bonding or Ag colloid bonding through the solder reflow process.

It will be apparent that the packaged manner in FIG. 4 is just an illustration, so those skilled in the art can form an electric loop by various constitutions. The optoelectronic semiconductor dies 502 and the submount 403 are electrically connected each other in the embodiment of FIG. 4, but they may be not electrically connected in another embodiment. For example, the metal lines 214 are directly bonded to pads (not shown) of the optoelectronic semiconductor dies 502 and connect to the conductive leads 215, so that the optoelectronic semiconductor dies 502 and the conductive lines 350 of the multilayer packaged substrate 310 will form an electric loop.

High heat flow density generated from operation of the optoelectronic semiconductor dies 502 is mainly conducted to the heat slug 416, and then a TIM 101 conducts the heat flow to the thermal sheet 320. Thereafter, the heat flow is conducted from another TIM 102 coated on the outer surface of the thermal sheet 320 to the heat dissipation device 338, and then to environment. The metal TIM of the present invention can be used as the TIM 101 between the heat slug 416 and the multilayer packaged substrate 310 and it also can be used as the TIM 102 between the multilayer packaged substrate 310 and the heat dissipation device 338.

Except for thermal interface application of foregoing different metal TIM, single- or multi-chip package, arrangement of joints and variation of integrations or disposition of different elements, the thermal element and the heat dissipation device also have different variation in the thermal management system of the packaged semiconductors. For instance, there is a micro-channel structure or a plate vapor chamber is inside the thermal element. Furthermore, a plurality of heat pipes may be installed in the bottom of the heat dissipation device, or the heat dissipation device may be a cold plates.

To sum up, the present invention provides a metal TIM including two essential elements, indium (In) and gallium (Ga) and at least one element of bismuth (Bi), tin (Sn), silver (Ag) and zinc (Zn). The metal TIM has a broad range of melting temperature, and thus it can be utilized to heat generating elements with different working temperature. The initial melting temperature of the metal TIM is more than 60° C. Although the specification of above embodiments mainly describes heat dissipation application of electronic components, the metal TIM of the present invention can be widely used in the thermal management system of any heat generating elements such as electronic components, optoelectronic components, thermoelectric components, micro-electromechanical components and so on, but is not limited thereto.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A metal thermal interface material (TIM), comprising about 20-98 wt % of In, about 0.03-4 wt % of Ga, and at least one element of Bi, Sn Ag and Zn, wherein the metal TIM has an initial melting temperature between about 60-144° C.

2. The metal TIM as claimed in claim 1, comprising In, Ga and only one element of Bi, Sn, Ag and Zn.

3. The metal TIM as claimed in claim 1, comprising In, Ga and two elements selected from Bi, Sn, Ag and Zn.

4. The metal TIM as claimed in claim 1, comprising In, Ga and three elements selected from Bi, Sn, Ag and Zn.

5. The metal TIM as claimed in claim 1, comprising In, Ga, and elements of Bi, Sn, Ag and Zn.

6. The metal TIM as claimed in claim 1, wherein a solvent with the maximum amount of composition of the metal TIM is In, Bi or Sn.

7. The metal TIM as claimed in claim 1, further comprising one or more other elements.

8. A packaged semiconductor, comprising:
a packaged substrate having a conductive line thereon;
an integrated circuit die disposed on a surface of the packaged substrate that has the conductive line;
a thermal element disposed on the integrated circuit die;
a heat dissipation device disposed on the thermal element; and
a printed circuit board electrically connected to the packaged substrate,
wherein a first TIM is disposed between the integrated circuit die and the thermal element, and a second TIM is disposed between the thermal element and the heat dissipation device,
wherein the first TIM and/or the second TIM is the metal TIM claimed in claim 1.

9. The packaged semiconductor as claimed in claim 8, wherein the thermal element is an integrated heat spreader (IHS) lid.

10. A packaged semiconductor, comprising:
a multilayer packaged substrate comprising a heat spreading material, a dielectric layer on the heat spreading material and a conductive line on the dielectric layer;
a die electrically connected to the conductive line of the multilayer packaged substrate;
a heat dissipation device disposed below the multilayer packaged substrate;
a first TIM disposed between the die and the multilayer packaged substrate; and
a second TIM disposed between the multilayer packaged substrate and the heat dissipation device,
wherein the first TIM and/or the second TIM is the metal TIM claimed in claim 1.

11. The packaged semiconductor as claimed in claim 10, wherein the die is an optoelectronic semiconductor.

12. A packaged semiconductor, comprising:
a semiconductor circuit device which is operated at a temperature range;
a thermal element having an inner surface and a outer surface, wherein the inner surface is disposed on the semiconductor circuit device;
a heat dissipation device disposed on the outer surface of the thermal element; and a TIM disposed at an interface of a thermal conduction path from the semiconductor circuit device to the heat dissipation device, wherein the TIM is the metal TIM claimed in claim 1.

13. The packaged semiconductor as claimed in claim 12, wherein the metal TIM is disposed in an interface of the semiconductor circuit device and the thermal element.

14. The packaged semiconductor as claimed in claim 12, wherein the metal TIM is disposed an interface of the thermal element and the heat dissipation device.

* * * * *

UNITED STATES PATENT AND TRADEMARK OFFICE
CERTIFICATE OF CORRECTION

| | | |
|---|---|---|
| PATENT NO. | : 7,952,192 B2 | Page 1 of 1 |
| APPLICATION NO. | : 12/477895 | |
| DATED | : May 31, 2011 | |
| INVENTOR(S) | : Yuan-Chang Fann et al. | |

It is certified that error appears in the above-identified patent and that said Letters Patent is hereby corrected as shown below:

On the cover page of the patent grant, please replace item (63) with the following:

Continuation-in-part of application No. 11/735,443,
filed on Apr. 14, 2007, now Pat. No. 7,576,428.

Signed and Sealed this
Twenty-third Day of August, 2011

David J. Kappos
*Director of the United States Patent and Trademark Office*